(12) United States Patent
Huang et al.

(10) Patent No.: US 11,121,169 B2
(45) Date of Patent: Sep. 14, 2021

(54) METAL VERTICAL TRANSFER GATE WITH HIGH-K DIELECTRIC PASSIVATION LINING

(71) Applicant: OmniVision Technologies, Inc., Santa Clara, CA (US)

(72) Inventors: Chiao-Ti Huang, Beaverton, OR (US); Shiyu Sun, Cupertino, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/452,272

(22) Filed: Jun. 25, 2019

(65) Prior Publication Data
US 2020/0411585 A1 Dec. 31, 2020

(51) Int. Cl.
*H01L 27/146* (2006.01)
*H01L 21/28* (2006.01)

(52) U.S. Cl.
CPC .... *H01L 27/14689* (2013.01); *H01L 27/1461* (2013.01); *H01L 27/1462* (2013.01); *H01L 27/14614* (2013.01); *H01L 21/28238* (2013.01); *H01L 27/14656* (2013.01)

(58) Field of Classification Search
CPC ......... H01L 27/14614; H01L 27/14656; H01L 27/14654
USPC ...................................................... 257/292
See application file for complete search history.

(56) References Cited

U.S. PATENT DOCUMENTS

| | | | | |
|---|---|---|---|---|
| 5,877,521 | A * | 3/1999 | Johnson | H01L 27/14603 257/223 |
| 5,904,493 | A * | 5/1999 | Lee | H01L 27/14831 438/57 |
| 5,965,875 | A * | 10/1999 | Merrill | H01L 27/14623 250/226 |
| 8,487,350 | B2 * | 7/2013 | Nozaki | H01L 27/14614 257/225 |
| 9,281,331 | B2 * | 3/2016 | Chen | H01L 27/1463 |
| 9,502,459 | B2 * | 11/2016 | Miyanami | H01L 27/1461 |
| 9,659,987 | B2 * | 5/2017 | Wang | H01L 27/14603 |
| 10,283,558 | B1 * | 5/2019 | Manabe | H04N 5/359 |
| 10,566,359 | B1 * | 2/2020 | Leung | H01L 21/32051 |
| 10,566,368 | B1 * | 2/2020 | Wu | H01L 27/14612 |
| 10,734,434 | B2 * | 8/2020 | Zheng | H01L 27/14656 |
| 2001/0023949 | A1 * | 9/2001 | Johnson | H01L 27/1463 257/222 |

(Continued)

*Primary Examiner* — Victoria K. Hall
(74) *Attorney, Agent, or Firm* — Lathrop GPM LLP

(57) ABSTRACT

A method for manufacturing an image sensor includes, for each of a plurality of photosensitive pixels of the image sensor, forming a trench in a semiconductor substrate of the image sensor, and depositing temporary transfer gate material in and above the trench. The method further includes, after the step of depositing temporary transfer gate material, high-temperature annealing at least a portion of the semiconductor substrate. In addition, the method includes, after the step of high-temperature annealing, (a) removing the temporary transfer gate material, thereby reopening the trench, (b) depositing a passivation lining, having a high-k dielectric, in the reopened trench, and (c) depositing metal on the high-k dielectric passivation lining to form a metal vertical transfer gate in the trench and extending above the trench.

13 Claims, 9 Drawing Sheets

(56) References Cited

U.S. PATENT DOCUMENTS

| | | | |
|---|---|---|---|
| 2006/0044429 A1* | 3/2006 | Toda | H01L 27/14647 348/272 |
| 2006/0084195 A1* | 4/2006 | Lyu | H01L 27/14609 438/48 |
| 2006/0146157 A1* | 7/2006 | Toros | H01L 27/14643 348/308 |
| 2007/0201738 A1* | 8/2007 | Toda | H04N 9/64 382/144 |
| 2007/0207599 A1* | 9/2007 | Shin | H01L 27/14601 438/510 |
| 2009/0001427 A1* | 1/2009 | Adkisson | H01L 27/14623 257/229 |
| 2009/0251582 A1* | 10/2009 | Oike | H04N 3/155 348/308 |
| 2009/0303371 A1* | 12/2009 | Watanabe | H01L 27/14647 348/311 |
| 2011/0001207 A1* | 1/2011 | Takase | H01L 27/1464 257/432 |
| 2011/0032405 A1* | 2/2011 | Nozaki | H01L 27/14603 348/308 |
| 2011/0241079 A1* | 10/2011 | Oike | H01L 27/14616 257/225 |
| 2011/0279721 A1* | 11/2011 | McMahon | H04N 5/36961 348/302 |
| 2012/0242875 A1* | 9/2012 | Nakamura | H01L 27/14689 348/294 |
| 2012/0281099 A1* | 11/2012 | Lenchenkov | H01L 27/14603 348/187 |
| 2013/0009224 A1* | 1/2013 | Ohri | H01L 27/14689 257/292 |
| 2013/0092982 A1* | 4/2013 | Chen | H01L 27/14689 257/223 |
| 2013/0147979 A1* | 6/2013 | McMahon | H04N 5/345 348/218.1 |
| 2013/0221410 A1* | 8/2013 | Ahn | H01L 27/14629 257/225 |
| 2013/0264467 A1* | 10/2013 | Hong | H01L 27/14609 250/208.1 |
| 2014/0084409 A1* | 3/2014 | Nagaraja | H01L 27/14654 257/445 |
| 2014/0103410 A1* | 4/2014 | Chen | H01L 27/14609 257/292 |
| 2014/0367552 A1* | 12/2014 | Hynecek | H01L 27/14614 250/208.1 |
| 2015/0008482 A1* | 1/2015 | Sato | H01L 27/14643 257/183.1 |
| 2015/0048474 A1* | 2/2015 | Ishiwata | H01L 27/14638 257/443 |
| 2015/0060951 A1* | 3/2015 | Hynecek | H01L 27/1464 257/228 |
| 2015/0279899 A1* | 10/2015 | Kim | H01L 27/14614 250/208.1 |
| 2015/0372034 A1* | 12/2015 | Chen | H01L 27/14614 257/292 |
| 2016/0028974 A1* | 1/2016 | Guidash | H04N 5/37455 348/294 |
| 2016/0240569 A1* | 8/2016 | Kuo | H01L 27/14614 |
| 2017/0078539 A1* | 3/2017 | Madurawe | H01L 27/14629 |
| 2017/0170223 A1* | 6/2017 | Hynecek | H01L 27/1464 |
| 2017/0200759 A1* | 7/2017 | Ihara | H01L 27/1461 |
| 2017/0358617 A1* | 12/2017 | Tekleab | H04N 5/361 |
| 2018/0012927 A1* | 1/2018 | Kido | H04N 5/3592 |
| 2018/0090536 A1* | 3/2018 | Mandai | H01L 27/14634 |
| 2018/0197910 A1* | 7/2018 | Lee | H01L 27/14609 |
| 2019/0057991 A1* | 2/2019 | Hung | H01L 27/1463 |
| 2019/0355778 A1* | 11/2019 | Zheng | H01L 27/14614 |
| 2019/0371845 A1* | 12/2019 | Chen | H01L 27/1461 |
| 2020/0035724 A1* | 1/2020 | Machida | H01L 27/14603 |
| 2020/0052013 A1* | 2/2020 | Wu | H01L 27/1461 |
| 2020/0266221 A1* | 8/2020 | Uchida | H01L 27/1461 |
| 2020/0286941 A1* | 9/2020 | Fukuoka | H01L 27/14612 |

* cited by examiner

METAL VERTICAL TRANSFER GATE WITH HIGH-K DIELECTRIC PASSIVATION LINING

BACKGROUND

A complementary metal-oxide-semiconductor (CMOS) image sensor includes an array of photosensitive pixels formed in and on a semiconductor substrate, generally a silicon substrate. Each pixel includes a photodiode that generates electron-hole pairs in response to incidence light, and a set of transistors for reading out the electrons. Multiple different pixel architectures exist. In the most common pixel architectures, e.g., the 4T pixel architecture, each pixel includes a pinned photodiode, a transfer gate, a floating diffusion region, and several other transistors for controlling the pixel and reading out photo-induced charge from the pinned photodiode. The transfer gate is between the photodiode and the floating diffusion region. When the transfer gate is off, charge generated by incident light accumulates in the photodiode. When the transfer gate is on, this photo-induced charge is transferred to the floating diffusion region, from where the photo-induced charge is read out via other transistors.

The pinned photodiode includes an n-doped region in the silicon substrate and a shallower p+ implant at the surface of the substrate. If the n-doped region is near a surface, defects in the surface may generate non-photo-induced charges that may lead to noise in the form a dark current or white pixels (pixels that produce high signal even in the absence of incident light). For this reason, it has been found advantageous to "bury" the n-doped region in the substrate (that is, position the n doped region away from the surface of the substrate) and then use a vertical transfer gate to transfer the photo-induced charge from the n-doped region to the floating diffusion region at the substrate surface. The vertical transfer gate is formed in a trench in the substrate, and this trench must be passivated to prevent generation of defects at the sidewalls of the trench. Typically, boron is implanted at the sidewalls of the trench to ensure such passivation.

SUMMARY

In an embodiment, a method for manufacturing an image sensor includes, for each of a plurality of photosensitive pixels of the image sensor, forming a trench in a semiconductor substrate of the image sensor, and depositing temporary transfer gate material in and above the trench. The method further includes, after the step of depositing temporary transfer gate material, high-temperature annealing at least a portion of the semiconductor substrate. In addition, the method includes, after the step of high-temperature annealing, (a) removing the temporary transfer gate material, thereby reopening the trench, (b) depositing a passivation lining, having a high-k dielectric, in the reopened trench, and (c) depositing metal on the passivation lining to form a metal vertical transfer gate in the trench and extending above the trench.

In an embodiment, an image sensor includes a semiconductor substrate with a plurality of photosensitive pixels. Each of the pixels includes (a) an n-doped photodiode region of the semiconductor substrate, (b) in and above a trench of the semiconductor substrate, a vertical transfer gate containing metal, and (c) along interfaces between the semiconductor substrate and the vertical transfer gate, a passivation lining containing a high-k dielectric. A minimum distance between the passivation lining and the n-doped photodiode region is less than 50 nanometers.

DESCRIPTION OF EXAMPLE EMBODIMENTS

Figure 1:
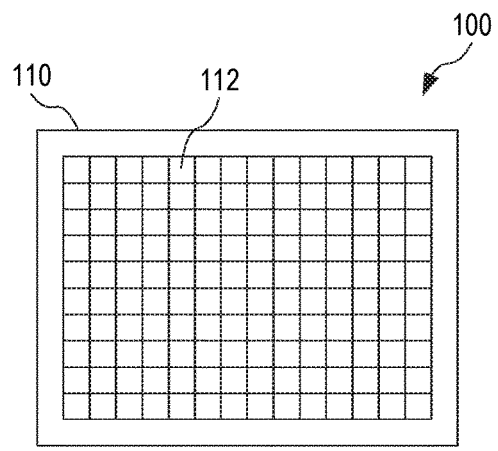
FIG. 1 illustrates a complementary metal-oxide-semiconductor (CMOS) image sensor having an array of photosensitive pixels, each including a metal vertical transfer gate (VTG) with a high-k dielectric passivation lining, according to an embodiment.
Figure 2:
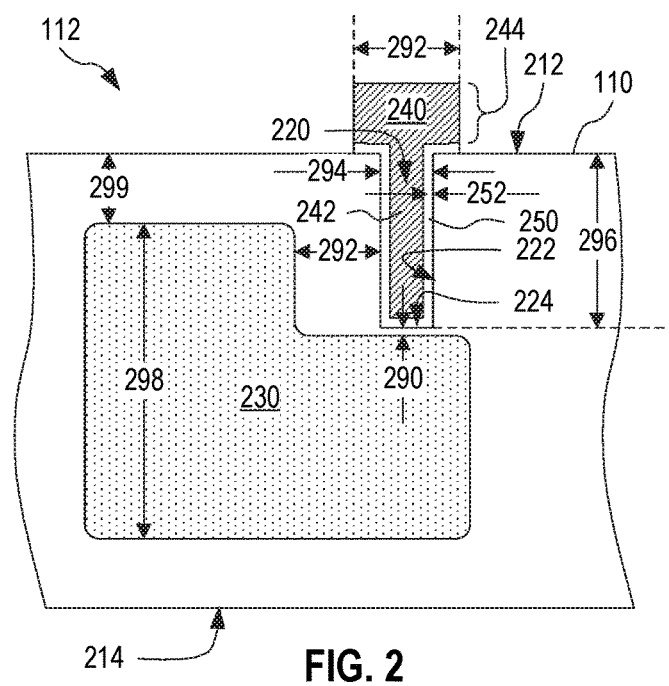
FIG. 2 is a more detailed view of a single instance of the pixels of the image sensor of FIG. 1.
Figure 3:
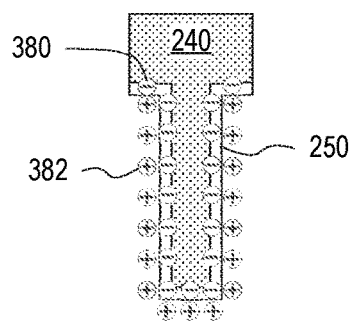
FIG. 3 schematically illustrates the charge distribution near the high-k dielectric passivation lining of the pixel of FIG. 2.

FIGS. 1, 2, and 3 illustrate one complementary metal-oxide-semiconductor (CMOS) image sensor 100 having an array of photosensitive pixels 112, each including a metal vertical transfer gate (VTG) 240 with a high-k dielectric passivation lining 250. FIG. 1 is a top plan view of image sensor 100 showing the array of pixels 112. FIG. 2 is a more detailed view of a single instance of pixel 112. FIG. 3 schematically illustrates charge distribution near high-k dielectric passivation lining 250. FIGS. 1, 2, and 3 are best viewed together in the following description.

Image sensor 100 includes a semiconductor substrate 110, for example a silicon substrate or a silicon substrate doped with impurities e.g., a p-type doped silicon substrate or an n-type doped silicon substrate. Pixels 112 are formed in and on substrate 110. Each instance of pixel 112 includes metal VTG 240, passivation lining 250, and a photodiode region 230 of substrate 110. Photodiode region 230 forms part of a photodiode of pixel 112. Photodiode region 230 may be doped with n-type dopant e.g., arsenic (As) and/or phosphorus (P). Metal VTG 240 is formed in and above a trench 220 in semiconductor substrate 110. Trench 220 extends from a front surface 212 of semiconductor substrate 110 down into semiconductor substrate 110 to reach or approach photodiode region 230, such that photo-induce charge accumulated in photodiode region 230 may be transferred out from photodiode region 230 to a floating diffusion region (not shown) by metal VTG 240. In one embodiment, photodiode region 230 may be served as the source of metal VTG 240 and the floating diffusion region may serve as a drain for metal VTG 240.

Image sensor 100 may be a backside illuminated image sensor configured to detect light incident on a back surface 214 of semiconductor substrate 110 opposite front surface 212. A color filter layer and a microlens layer may be formed on back surface 214. Photodiode region 230 of pixel 112 may generate photo-induced charges in response to incident light received from back surface 214. One or more interlayer dielectric layers and metallic interconnect layers may be formed on front surface 212 of semiconductor substrate 110.

Passivation lining 250 is disposed along interfaces between semiconductor substrate 110 and metal VTG 240. Passivation lining 250 lines sidewalls 222 and bottom wall 224 of trench 220, thus spanning the interface between semiconductor substrate 110 and a portion 242 of metal VTG 240 disposed in trench 220. In certain embodiments, metal VTG 240 includes a planar cap 244 above trench 220 that extends laterally along front surface 212 away from trench 220. In such embodiments, passivation lining 250 also lines the interface between front surface 212 and planar cap 244. In other words, in such embodiments, passivation lining 250 passivates the interface between planar cap 244 and front surface 212, the interface between sidewalls 222 of trench 220 and semiconductor substrate 110, and the interface between bottom wall 224 of trench 220 and semiconductor substrate 110. Passivation lining 250 is formed by depositing a high-k dielectric material, i.e., a material with a dielectric constant κ greater than 3.9 in the trench 220. Passivation lining 250 or high-k dielectric passivation lining 250 may be used interchangeably hereinafter. Passivation lining 250 may be composed of, or include, one or more of aluminum oxide, hafnium oxide, and tantalum oxide. Metal VTG 240 may be composed of, or include, one or more of tungsten, copper, and aluminum.

As depicted in FIG. 3, passivation lining 250 has negative charges 380. Negative charges 380 induce a hole-accumulation layer, indicated by holes 382, in semiconductor substrate 110. Thus, passivation lining 250 can expel electrons from the immediately adjacent region of semiconductor substrate 110. In the absence of passivation lining 250, free electrons induced by surface defects at the walls of trench 220 would be transferred by metal VTG 240 and appear in images captured by image sensor 100 as dark current or white pixels. The thickness 252 of passivation lining 250 may be in the range between 10 and 300 angstroms.

Passivation lining 250 is more effective than conventional boron implantation of vertical trenches. Since conventional processes require dopant annealing after implantation of the boron at the walls of the vertical trenches, the boron implants may diffuse away from the vertical trenches. This diffusion not only compensates the n-doped photodiode region, thereby reducing full-well capacity, but also degrades the passivation effect provided by the boron implants. Therefore, boron-based passivation would require a greater separation distance between the vertical trenches and any n-doped photodiode regions, as compared to the separation distance required with passivation lining 250. The greater separation, required with boron-based passivation, in turn (a) reduces the possible size of the n-doped photodiode regions, thereby diminishing their full well capacity, and/or (b) forces a greater overall size of each pixel, thereby reducing pixel resolution or increasing total size of the image sensor array. In addition, effective boron implantation is difficult to achieve for trenches with a high aspect ratio (deep and narrow), in which case an even greater separation distance is required by the deepest parts of the trenches and the n-doped photodiode regions. Furthermore, the conventional $n^+$ type-polysilicon vertical transfer gates, typically used in conjunction with boron-aided passivation, may suffer from inefficient $n^+$-implantation near the bottom of deep trenches, thereby reducing conductivity of the vertical transfer gate itself.

By virtue of the effective passivation provided by passivation lining 250, photodiode region 230 may be placed closer to trench 220 than what is achievable in an image sensor with boron passivation of the trench walls. In one embodiment, a distance 290 between bottom wall 224 and a portion of photodiode region 230 is less than 50 nanometers, whereas a distance of 50-150 nanometers is typically required in image sensors with boron implantation. Distance 290 may even be zero such that bottom wall 224 of trench 220 is in direct contact with photodiode region 230. Similarly, a distance 292 between sidewalls 222 and a side of photodiode region 230 may be less than 100 nanometers, whereas a distance of greater than 100 nanometers is typically required in image sensors with boron implantation. Small distances 290 and 292 allow for maximizing the full well capacity of photodiode region 230 within the spatial constraints of pixel 112.

In addition, metal VTG 240 has better conductivity than a polysilicon VTG, especially near the bottom of trench 220 where the conductivity of a polysilicon VTG may suffer from insufficient $n^+$-type doping. Combined with the effective passivation provided by passivation lining 250, even near the bottom of trench 220, metal VTG 240 provides effective charge transfer at a greater depth from front surface 212, as compared to an image sensor having polysilicon transfer gates and boron passivation. Thus, photodiode region 230 may be buried deeper beneath front surface 212, so as to reduce any dark current or white pixels stemming from surface defects at front surface 212. In one embodiment, the distance 299 between a top portion of photodiode region 230 and front surface 212 is at least 180 nanometers. In one embodiment, distance 299 is between 180 and 250 nanometers.

The dopant concentration in photodiode region 230 may be uniform or non-uniform. In one embodiment, photodiode region 230 may be a gradient doping region.

In one embodiment, photodiode region 230 may be formed by implanting n-type dopant of arsenic (As) of doses $10^{11}$~$10^{13}$ atoms/cm$^2$ a number of times with different implant energy to obtain a desired doping profile for achieving a desired full well capacity. In this embodiment, the concentration of n dopants decreases, gradually or in a stepwise manner, as a function of distance from front surface 212 into semiconductor substrate 110.

The depth 296 of trench 220 is at least 300 nanometers. The transverse width 294 of trench 220 may be between 50 and 300 nanometers. The height 298 of photodiode region 230 in semiconductor substrate 110 is, for example, in the range between one and five microns, depending upon the image sensor requirements.

In one embodiment, associated transistor devices such as a reset transistor, a source follower (or amplification transistor), and a row select transistor may be formed on semiconductor substrate 110 and above photodiode region 230 to further realize pixel minimization. For example, a reset gate electrode of a reset transistor associated with pixel 112 may be formed vertically above photodiode region 230 on front surface 212 with a gate oxide lining layer formed underneath. Source and drain doped regions, associated with the reset gate electrode, may be formed in semiconductor substrate 110 below gate oxide lining layer for forming the conducting channel for the reset transistor. In another example, a source-follower gate electrode of a source follower transistor associated with pixel 112 may be formed on front surface 212 vertically above photodiode region 230 with a gate oxide lining layer formed underneath. Source and drain doped regions, associated with the source-follower gate electrode, may be formed in semiconductor substrate 110 below the gate oxide lining layer for forming the conduction channel associated with the source follower transistor. In one embodiment, a gate oxide lining layer formed underneath the source-follower gate electrode may be a high-k dielectric layer to increase the transconductance $g_m$ of the source follower transistor, and this high-k dielectric layer may be formed at same time as passivation lining 250.

Although depicted in FIGS. 2 and 3 as having vertical sidewalls 222, trench 220 may have slanted sidewalls 222, such that the transverse width 294, in at least one transverse dimension, decreases with distance away from front surface 212, without departing from the scope hereof. Also without departing from the scope hereof, photodiode region 230 may have a shaped different from that depicted in FIG. 2, for example a cuboid.

In one embodiment, image sensor 100 may be implemented in a multiple-wafer, multi-die, stacked image sensor module, such as a two-die stacked image sensor module. In this embodiment, image sensor 100 is formed on/in an image sensor wafer and logic circuitry is formed on/in a logic wafer. The image sensor wafer may be bonded to the logic wafer through die-to-die or wafer-to-wafer bonding, such as hybrid bonding. In this embodiment, image sensor 100 and associated logic circuitry can be formed separately, such that image sensor 100 is not exposed to the high-temperature annealing steps, required for forming transistors in the logic circuitry, that otherwise may compromise the metal VTGs and associated high-k dielectric passivation linings.

Figure 4:
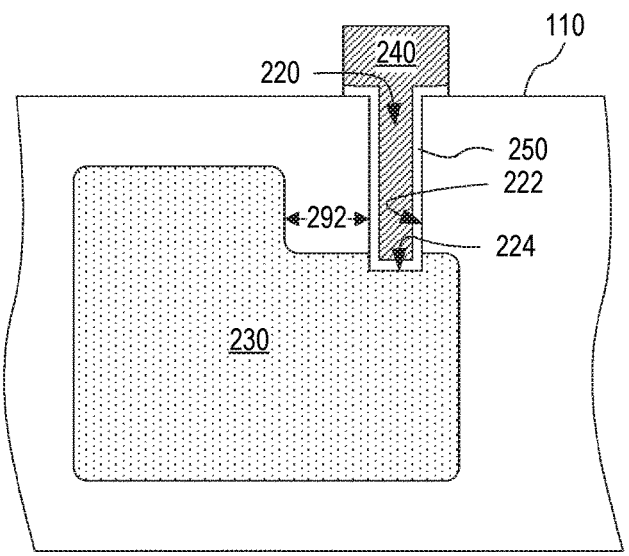
FIG. 4 illustrates one photosensitive pixel including a metal vertical transfer gate (VTG) with a high-k dielectric passivation lining, according to an embodiment.

FIG. 4 illustrates one photosensitive pixel 400 formed in and on substrate 110. Pixel 400 is an embodiment of pixel 112, wherein bottom wall 224 of trench 220 is in direct contact with photodiode region 230, i.e., distance 290 is zero. Although depicted with a non-zero value of distance 292, pixel 400 may, without departing from the scope hereof, be configured with a zero value of distance 292 as well, such that both bottom wall 224 and one or more sidewalls 222 are in direct contact with photodiode region 230.

FIGS. 5-11 illustrate a method 500 for manufacturing an image sensor with metal VTGs and high-k dielectric passivation lining. Method 500 may be used to manufacture image sensor 100. Method 500 benefits from the formation of temporary "dummy" VTGs that are replaced with metal VTGs, and associated high-k dielectric passivation linings, only after completion of high-temperature annealing steps that otherwise may compromise the metal VTGs and associated high-k dielectric passivation linings. Method 500 thereby may avoid losing the negative charges from the high-k dielectric passivation linings. As a result, method 500 achieves improved passivation, as compared to conventional boron passivation. In addition, the metal VTG has superior conductivity, as compared to conventional $n^+$-type doped polysilicon.

Figure 5:
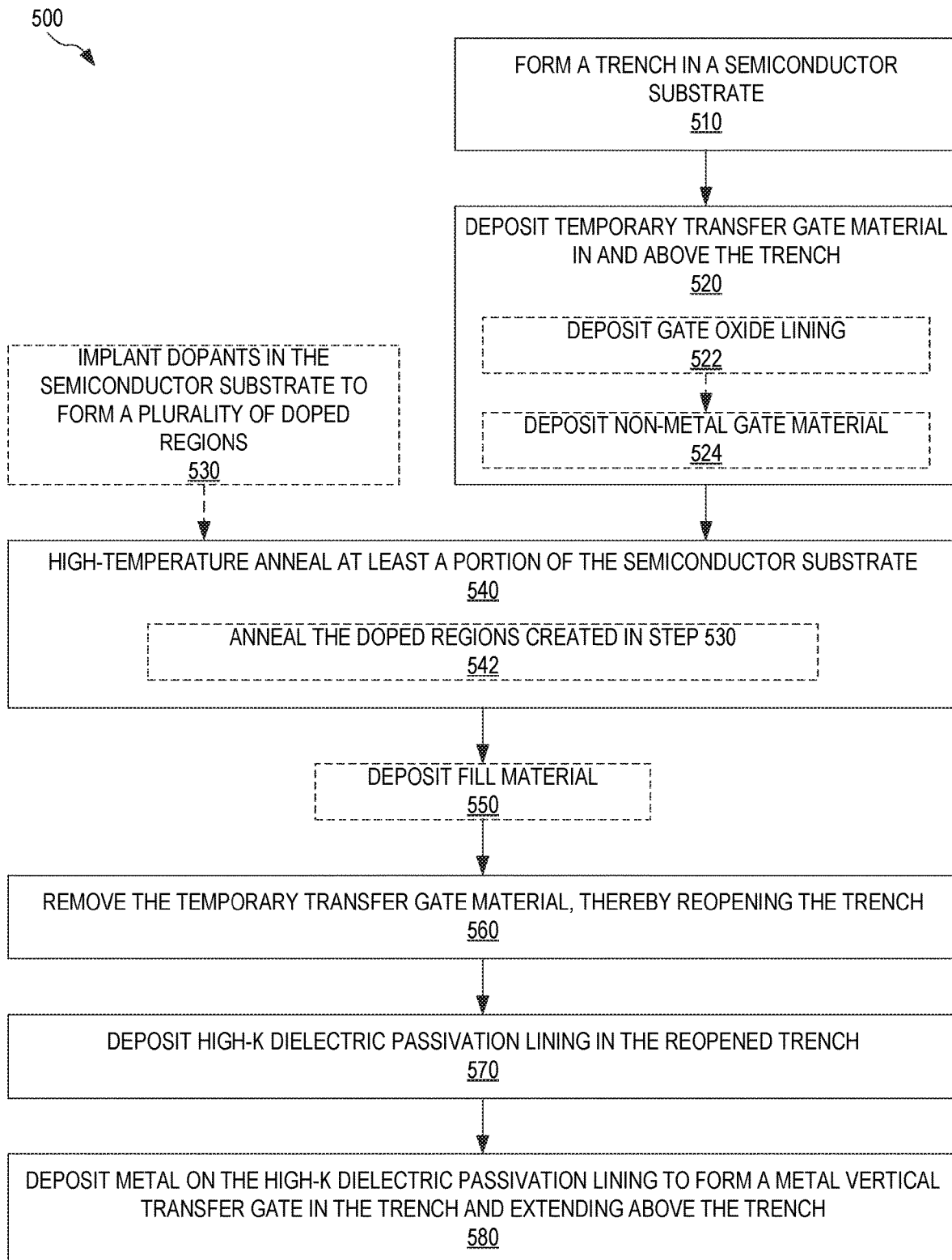
FIG. 5 is a flowchart for a method for manufacturing an image sensor with metal VTGs and high-k dielectric passivation lining, according to an embodiment.

FIG. 5 is a flowchart for method 500. FIGS. 6-11 are diagrams illustrating one example of certain steps of method 500 resulting in the formation of a photosensitive pixel 1100 (see FIG. 11). Pixel 1100 is an embodiment of pixel 112. FIGS. 5-11 are best viewed together in the following description.

Figure 6:
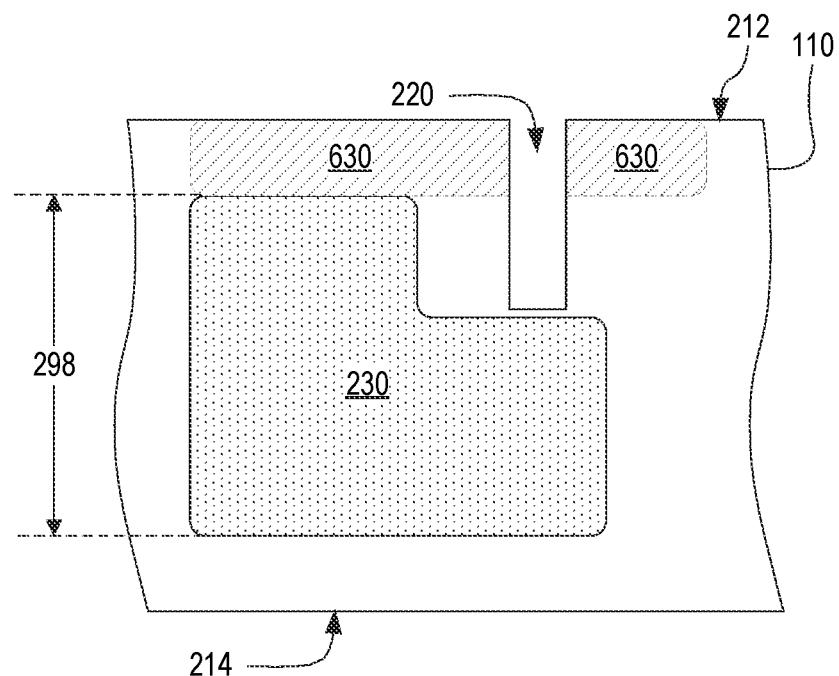
FIGS. 6-11 illustrate an example of certain steps of the method of FIG. 5, as well as one embodiment of the pixel of FIG. 2 resulting from this example.

A step 510 forms a trench in a semiconductor substrate. Step 510 is performed for each photosensitive pixel of the image sensor. Step 510 may utilize etching, such as dry or wet etching process, to form the trench. FIG. 6 shows one example of step 510. In this example, the input to step 510 is a semiconductor substrate 110 with photodiode region 230 already formed therein for each pixel. Step 510 forms trench 220 in semiconductor substrate 110. The depth of trench 220 may correspond approximately to the depth of photodiode region 230. Step 510 may etch trench 220 from front surface 212 into semiconductor substrate 110 through a lithography process, e.g., patterning, masking and etching processes. In one embodiment, in step 510, a hard mask material (such as nitride) is first deposited on front surface 212 of semiconductor substrate 110. An opening area for trench 220 may be defined by lithography thereafter. Then, one or more etching process may be performed to etch away the hard mask and the respective region of semiconductor substrate 110 underneath to form trench 220 of desired depth.

In certain implementations, each pixel further includes a charge overflow layer 630 between front surface 212 and photodiode region 230. Charge overflow layer 630 is an n-doped region and operatively provides a leakage path from photodiode region 230 to a floating diffusion region (typically formed in a later step) for excess photo-induced electrons accumulated in photodiode region 230. Charge overflow layer 630 may thereby prevent blooming that otherwise may result when such excess photo-induced electrons diffuse to neighboring pixels.

After step 510, a step 520 deposits temporary transfer gate material in and above the trench, to form a temporary dummy VTG. Step 520 is performed for each photosensitive pixel of the image sensor. The temporary transfer gate material may be a non-metallic material such as polysilicon. The temporary transfer gate material may extend along a portion of front surface 212 around the opening of trench 220 to form a cap above trench 220. In one embodiment, step 520 includes steps 522 and 524. Step 522 deposits a sacrificial gate oxide lining layer on all surfaces (e.g., trench sidewalls and bottom wall) of trench 220, for example using chemical vapor deposition (CVD). Step 524 deposits a non-metal gate material (such as polysilicon) in trench 220, for example using CVD.

Figure 7:
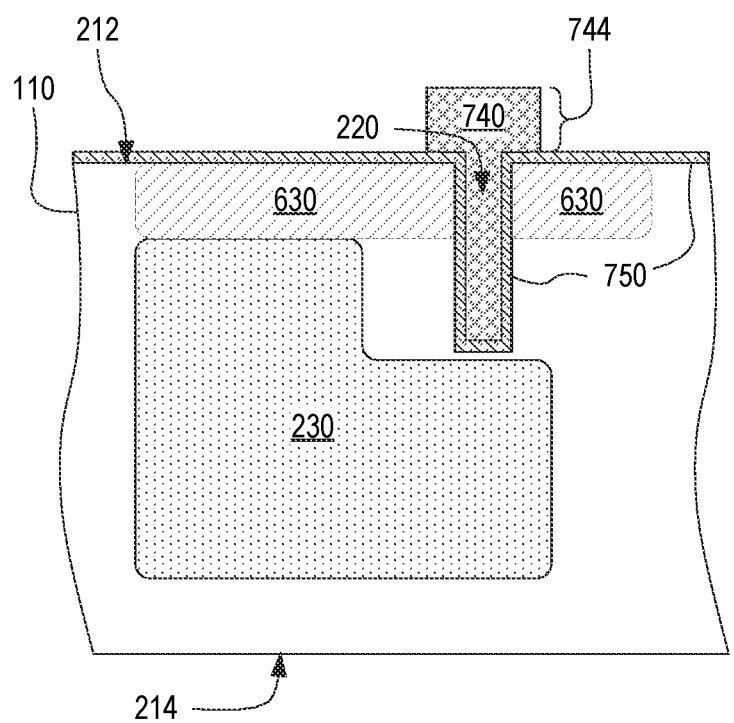

In implementations where the temporary transfer gate material extends along the front surface (e.g., front surface 212), step 522 deposits gate oxide lining in the trench and on the front surface, and step 524 deposits non-metal gate material on this gate oxide lining layer. FIG. 7 shows one example of step 520, implementing steps 522 and 524, which forms a temporary dummy VTG 740. In this example, step 522 deposits a gate oxide lining layer 750 on all surfaces of trench 220 and on front surface 212. Next, in step 524, non-metal material, such as polysilicon, is deposited on gate oxide lining layer 750 to fill trench 220 and form a cap 744.

In one embodiment, the step of depositing temporary transfer gate material to form the temporary dummy VTG may include depositing doped gate material to form polysilicon gates for other transistor devices including reset transistors, source followers (or amplification transistors), row select transistors for one or more pixels.

A step 530 implants dopants in the semiconductor substrate to form a plurality of doped regions. Step 530 is followed by an annealing process, in a step 540, with high temperature (e.g., greater than 1000° C.) to activate the dopants. Step 530 is performed for each photosensitive pixel of the image sensor.

In one embodiment, a number of doped regions may be formed in the semiconductor substrate by masking and ion implantation, wherein masks are formed to cover all the surface except the doping region to form photodiode region 230 of a gradient doping profile, i.e., wherein the dopant concentration decreases as a distance from front surface 212 increases.

In another embodiment, step 530 implants (a) the dopants required to form photodiode region 230, and optionally also charge overflow layer 630 as shown in FIG. 6 before step 510.

Step 530 may be performed to form doping regions in the semiconductor substrate before step 510, between steps 510 and 520, between steps 520 and 540, or any combination thereof.

In one embodiment where step 530 is performed before step 510, step 540 may be applied to the semiconductor substrate after step 530 to form photodiode region 230.

In one embodiment where step 530 is performed before step 540, step 540 may include a step 542. Step 542 anneals the doped regions formed in step 530.

It is appreciated to those skilled in the art that the annealing process with high temperature in step 540 may include one or more annealing processes and applied to the semiconductor substrate or at least a portion thereof.

In one embodiment, step 540 further includes applying an annealing process with high-temperature to the semiconductor substrate, or a portion thereof, to anneal n-type dopants implanted to form n-type polysilicon gates in semiconductor substrate 110 for transistor devices, such as reset transistors, source followers (or amplification transistors), and row select transistors for all pixels.

In one embodiment, after step 524, i.e., after the formation of the temporary dummy VTG, multiple ion implantation may be further performed to the semiconductor substrate to form doping regions including a charge overflow layer, a floating diffusion region, and source/drain of other transistors devices (e.g., reset transistor, source follower), and a pinning layer for passivation, followed by the subsequently high temperature annealing process in step 540 to activate the implanted dopants. In an embodiment, each of the floating diffusion region and the photodiode region are doped with n-type dopants, the semiconductor substrate and the pinning layer are doped with p-type dopants. In another embodiment, the polarity of the photodiode region, the floating diffusion region, and the pinning layer is reversed, such that the photodiode region and the floating diffusion region are doped with p-type dopants, the pinning layer and the semiconductor substrate are doped with n-type dopants. Dopant implantation performed between steps 520 and 540 may utilize the dummy gate formed by the temporary transfer gate material as landmarks upon which the aiming of dopant implantation is based. Step 540 may be applied to all pixels simultaneously.

Figure 8:
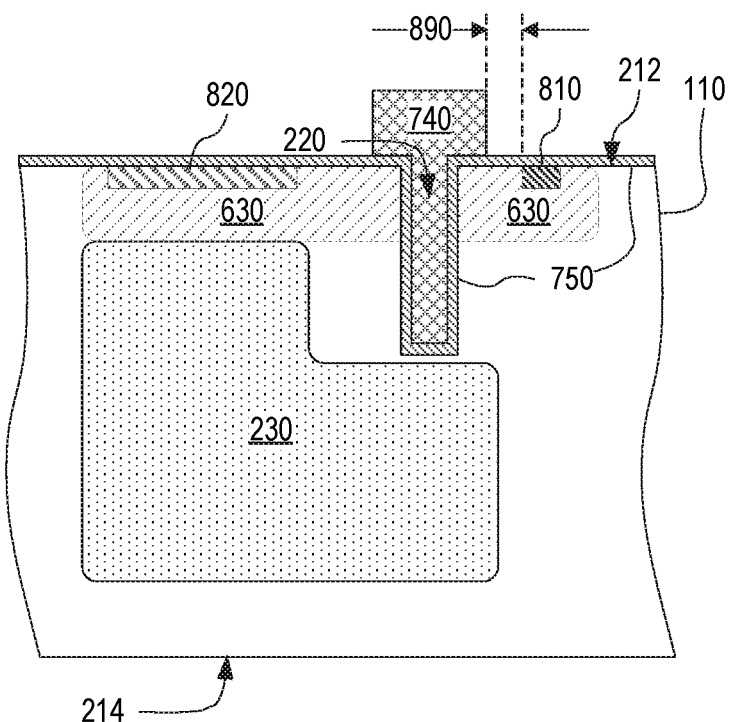

FIG. 8 illustrates an example of step 530. In this example, (a) n-type dopants are implanted before step 510 to form photodiode region 230 and, optionally, charge overflow layer 630. Between steps 520 and 540, this example of step 530 implants (a) p-type dopants at or near front surface 212 to form a p$^+$-type doped pinning layer 820 for passivation the interface between front surface 212 and photodiode region 230 and (b) n-type dopants at or near front surface 212 to form an n$^+$-doped floating diffusion region 810. Floating diffusion region 810 is configured to receive the charge transferred out of photodiode region 230 by the metal VTG (formed later in method 500). Each of pinning layer 820 and floating diffusion region 810 may be embedded in charge overflow layer 630. In one implementation, floating diffusion region 810 is a non-zero distance 890 away from the temporary transfer gate material, and, as will be apparent from the following discussion, floating diffusion region 810 will therefore will be non-zero distance 890 away from the metal VTG formed in a later step of method 500.

After step 540, method performs steps 560, 570, and 580 to replace the temporary transfer gate material with the metal VTG and associated high-k dielectric material passivation lining. For each pixel, step 560 removes the temporary transfer gate material of the temporary dummy VTG (e.g., temporary dummy VTG 740) and thereby reopens the trench e.g., by hard masking and etching process. In one implementation, the temporary transfer gate material may be etched by dry or wet etching or a combination thereof.

Figure 10:
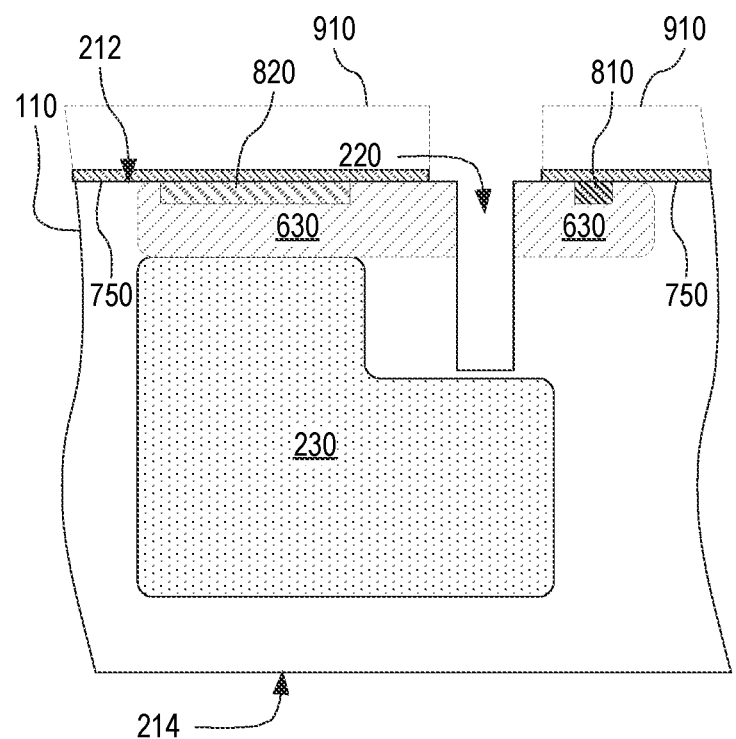

In one example, only a portion of gate oxide lining layer 750 deposited inside trench 220 underneath the temporary transfer gate material is removed during the process of removal temporary dummy VTG 740, while the portion deposited outside the trench structure is left to cover front surface 212 of semiconductor substrate 110 as shown in FIG. 10.

In another example, gate oxide lining layer 750 on front surface 212 is removed from front surface 212 by dry or wet etching during the process of forming temporary dummy VTG 740, e.g., during a process of etching the non-metal material to form temporary dummy VTG 740.

In yet another example, all of the gate oxide lining layer not covered by the non-metal material is removed while the portion covered by the non-metal material, e.g., a portion immediate adjacent to trench, is left until the removal of the temporary dummy VTG 740.

Step 570 deposits a passivation lining in the reopened trench of each pixel. In embodiments, where the temporary transfer gate material was deposited also on a portion of the front surface of the semiconductor substrate adjacent the trench, step 570 also deposits the passivation lining (e.g., passivation lining 250) on this portion of the front surface. The passivation lining is formed of dielectric material having dielectric constant greater than 3.9. Step 570 may utilize ion deposition, such as chemical vapor deposition (CVD), physical vapor deposition (PVD), and/or atomic layer deposition (ALD), to achieve reliable deposition even for high-aspect-ratio embodiments of the trench. Step 580 deposits metal on the passivation lining to form a metal VTG in the trench and extending above the trench. Step 580 may utilize chemical vapor deposition or metal sputtering process.

In one example, the gate oxide lining layer (e.g., gate oxide lining layer 750) is removed from the front surface of the semiconductor substrate, and a layer of high-k dielectric layer is deposited covering the front surface of the semiconductor substrate during the deposition process of high-k dielectric passivation lining.

Step 560 may be preceded by a step 550 that deposits a fill material on the front surface of the semiconductor substrate. Step 550 is common to all pixels and is not performed separately for each pixel. The fill material fills the space on the front surface of the semiconductor substrate that is between the temporary transfer gate material formed for the different pixels forming an interlayer dielectric layer (ILD). The fill material may be predominantly composed of a dielectric.

In one embodiment, the metal deposition of step 580 may initially deposit metal over the fill material and generally to a height above the front surface of the semiconductor substrate that is beyond both the height of the fill material and the desired height of the metal VTG. In this embodiment, step 580 further includes removing such excess metal and planarizing the surface of the fill material and metal VTGs, for example through a metal etch-back process.

Figure 9:
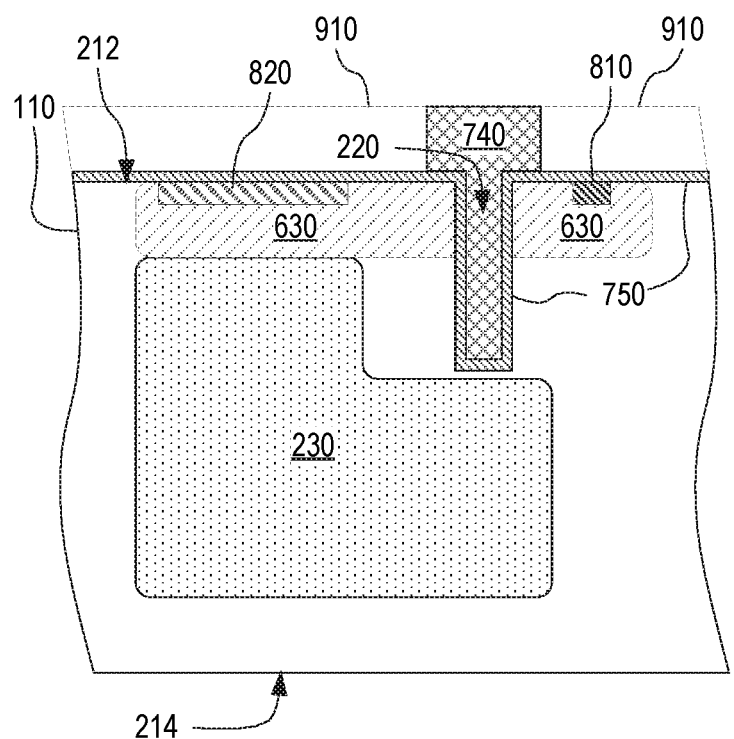
Figure 11:
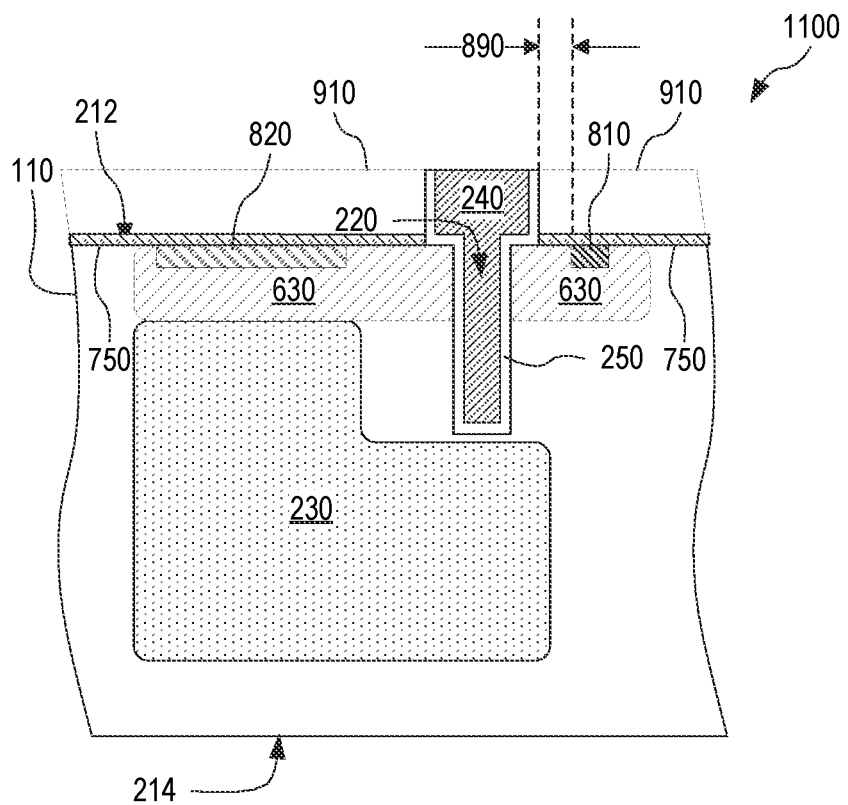

FIGS. 9, 10, and 11 collectively provide an example of steps 560, 570, and 580. In some embodiments, steps 560, 570, and 580 are preceded by a step 550, such that the interlayer dielectric layer is deposited after the formation of metal VTGs. This example is based upon the structure depicted in FIG. 8. In this example, step 550, if included, deposits fill material 910 (see FIG. 9) on front surface 212 to fill the space between the temporary transfer gate material of the different pixels. Step 560 removes the temporary transfer gate material to reopen trench 220, as illustrated in FIG. 10. In implementations that include step 550, step 560 also results in the formation of an opening in the fill material at trench 220. Step 560 may first remove non-metal material 740 using a first etching process that stops on gate oxide lining layer 750, and subsequently remove gate oxide lining layer 750 using a second etching process. This two-step etching process allows for removing non-metal conductor 740 efficiently using an etching process that, without the protection provided by gate oxide lining layer 750, could be damaging to semiconductor substrate 110. In one example, non-metal material 740 may be removed by dry etching, and gate oxide lining layer 750 may be removed by wet etching. Further, in this example, step 570 deposits high-k dielectric passivation lining 250 into the reopened trench passivating sidewalls and bottom wall of the reopened trench. Step 580 deposits metal on passivation lining 250 to form metal VTG 240 (see FIG. 11), so as to form a portion of pixel 1100 in/on semiconductor substrate 110. Passivation lining 250 and metal VTG 240 collectively occupy the space previously occupied, collectively, by gate oxide lining layer 750 and non-metal material 740. In implementations that include step 550, step 570 may deposit passivation lining also on walls of fill material 910 facing the opening formed in step 560.

Figure 12:
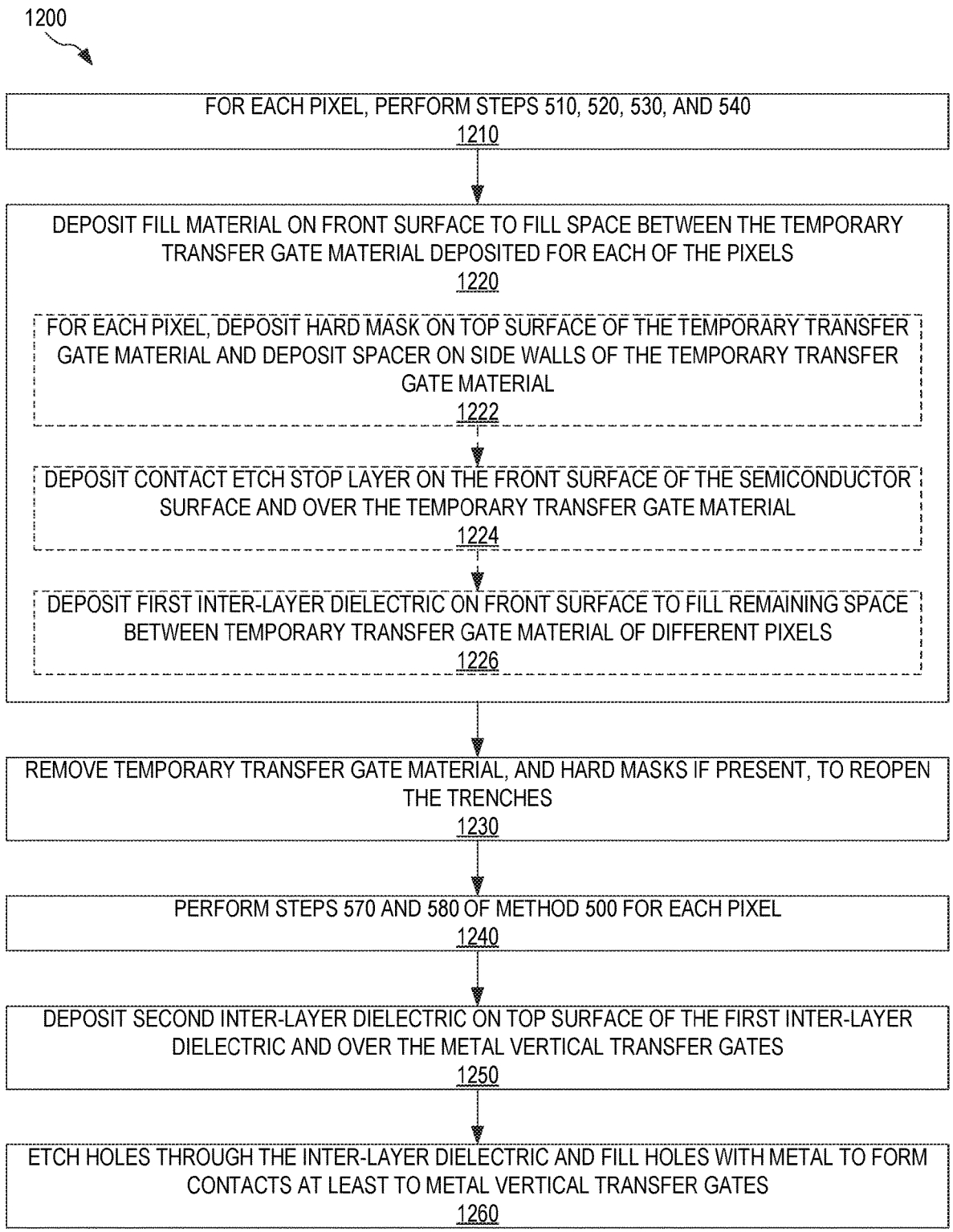
FIG. 12 is a flowchart for another method for manufacturing an image sensor with metal VTGs and high-k dielectric passivation lining, according to an embodiment.
Figure 13:
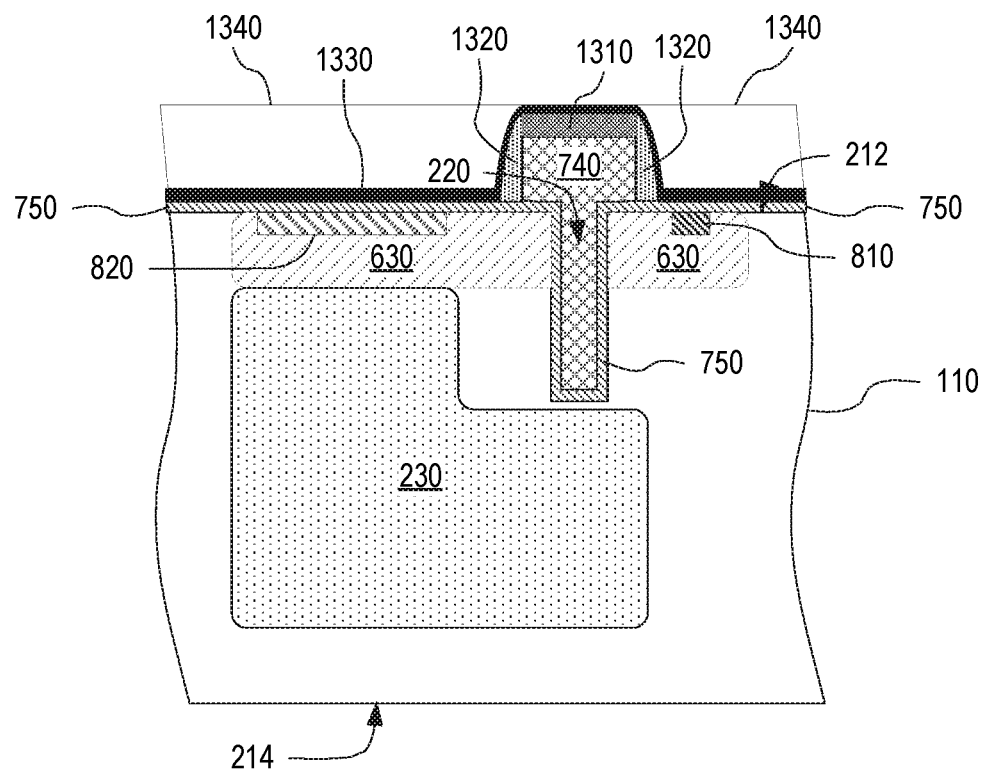
FIGS. 13-16 illustrate an example of certain steps of the method of FIG. 12, as well as one embodiment of the pixel of FIG. 11 resulting from this example.

FIGS. 12-16 illustrate another method 1200 of manufacturing an image sensor with metal VTGs and high-k dielectric passivation lining. Method 1200 is an embodiment of method 500. FIG. 12 is a flowchart for method 1200. FIGS. 13-16 are diagrams illustrating one example of certain steps of method 1200 resulting in the formation of a photosensitive pixel 1600 (see FIG. 16). Pixel 1600 is an embodiment of pixel 1100. FIGS. 12-16 are best viewed together in the following description.

A step 1210 performs steps 510, 520, 530, 540 of method 500 for each pixel of the image sensor, for example resulting in the structure depicted in FIG. 8.

A hard mask material (e.g., nitride) may be deposited on the front surface of the semiconductor substrate to form a first hard mask layer. The trench opening may be defined on the first hard mask layer after a lithography process followed by etching the first hard mask layer and silicon underneath accordingly to form the trench for the temporary transfer gate material or temporary dummy VTG.

In one embodiment of step 1210, step 520 further includes depositing gate oxide lining on all surfaces of the trench and on the front surface, and depositing non-metal gate material with n-type dopant implanted followed by an annealing process to form planar or non-planar polysilicon gate electrodes for transistor devices (e.g., reset transistors, source followers, amplification transistors, and/or row select transistors) associated with pixels. In one embodiment of step 1210, step 530 may be performed before step 510. For example, a plurality of dopant regions may be implanted followed by a high temperature annealing process of step 540 to form photodiode region and charge overflow layer before the formation of temporary dummy VTG. In another embodiment of step 1210, step 530 may be performed after forming temporary dummy VTG i.e., after step 520.

In one embodiment, step 1210 includes, after step 520, multiple ion implantation processes followed by one or more annealing processes to activate implanted dopants of step 540 may be performed after step 520 to form a plurality of doping regions, such as n-type floating diffusion regions, p-type pinning layer, source/drain regions for transistor devices associated with pixels including reset transistors, source followers (or amplification transistors), row select transistors.

In step 1220, fill material is deposited on the front surface of the semiconductor substrate to fill the space between the temporary transfer gate material for the temporary dummy VTG deposited for each of the pixels. Step 1220 is an embodiment of step 550 of method 500. Step 1220 may further include steps 1222, 1224, and 1226.

In one embodiment, before step 1220, another layer of hard mask material (a second layer of hard mask), e.g., nitride, may be deposited, patterned by lithography process, and etched to cover and mask the temporary dummy VTGs.

For each pixel, in step 1222, another layer of hard mask material (a second layer of hard mask) may be deposited, patterned by a lithography process, and etched to cover and mask the top surface of the temporary transfer gate material of the temporary dummy VTGs. For example, step 1222 may deposit hard mask 1310 and spacer 1320 depicted in FIG. 13. Hard mask 1310 and spacer 1320 may be composed of a nitride.

Subsequently, spacers 1320 are formed on sidewalls of the temporary dummy VTGs by dielectric deposition and corresponding etching, for protecting sidewalls of VTGs and separating gates from the source and the drain regions of vertical transfer gate. Spacer 1320 may be formed in a single layer or multilayer stack and composed of material from nitride oxide, or low-k material such as boron (B), carbon (C), oxygen (O), and nitrogen (N). The thickness of spacer 1320 may range from 50 to 1000 Å.

It is worth to note that typically the hard mask covering top surface of temporary transfer gate material needs to be removed before the formation of spacers, however, in the present disclosure, the temporary dummy VTGs are to be removed later, thus the layer of hard mask covering on top surface of temporary dummy VTG transfer gate may be kept for subsequent chemical mechanical planarization (CMP) process.

Step 1224, performed after step 1222, deposits a contact etch stop layer (e.g., contact etch stop layer 1330 of FIG. 13) on the front surface of the semiconductor surface and over the temporary transfer gate material. Step 1226 is performed after step 1224 and deposits a first inter-layer dielectric (e.g., inter-layer dielectric 1340 of FIG. 13) on the front surface to fill the remaining space between the temporary transfer gate material of temporary dummy VTG associated of different pixels. The first inter-layer dielectric may be an oxide, for example silicon oxide. Step 1226 may first form an inter-layer dielectric that is taller than depicted in FIG. 13, and planarized the inter-layer dielectric thereafter, for example, using chemical-mechanical planarization (CMP) process, to match the height of inter-layer dielectric 1340 to the height of hard mask 1310 with contact etch stop layer 1330 thereon.

Figure 14:
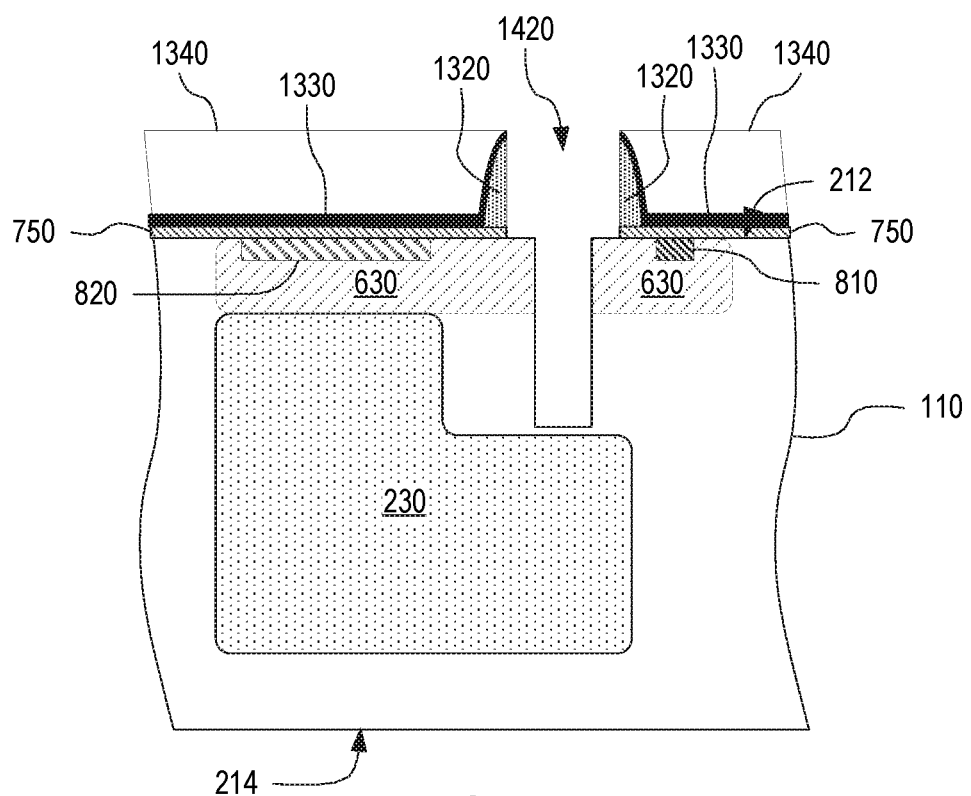

A step 1230, performed after step 1220, removes the temporary transfer gate material of the temporary dummy VTGs by selectively etching (e.g., dry or wet etch) to reopen the trenches. In embodiments of method 1200 that include step 1222, step 1230 removes the contact etch stop layer 1330 and hard mask 1310 directly above the temporary transfer gate material by a patterning and etching process before removing the temporary transfer gate material of the temporary dummy VTGs. The etching process to reopen the trenches may selectively etch through the temporary transfer gate material and stop on a gate oxide layer formed on the front surface of the semiconductor substrate, thereby preventing the semiconductor substrate from being damaged. Step 1230 is an embodiment of step 560 of method 500. FIG. 14 provides an example of step 1230. In this example, step 1230 forms a trench 1420 that includes the original trench 220 and a space above trench 220, both vacated by the temporary transfer gate material (e.g., non-metal material 740 and gate oxide lining layer 750).

In one example, during the formation of temporary dummy VTGs in step 1210, gate oxide lining layer 750 deposited on front surface may be removed from front surface 212 e.g., by a selective etching process. During the formation of temporary dummy VTGs in step 1210, gate oxide lining layer 750 deposited on front surface 212 may be selectively removed, e.g., all of gate oxide lining layer 750 may be removed except a portion immediate adjacent to trench 220 and underneath the non-metal gate material.

In another example, only a portion of gate oxide lining layer 750 deposited inside trench 220 underneath the temporary transfer gate material is removed during the removal of the temporary dummy VTG of step 1230, while the portion deposited outside the trench structure are left to cover front surface 212 of semiconductor substrate 110 as shown in FIG. 10.

In one further example, only a portion of gate oxide lining layer 750 covering front surface are left for forming the gate of a transistor device thereafter, while the rest of gate oxide lining layer 750 are removed during the formation of temporary dummy VTGs, e.g., by a selectively etching process.

Figure 15:
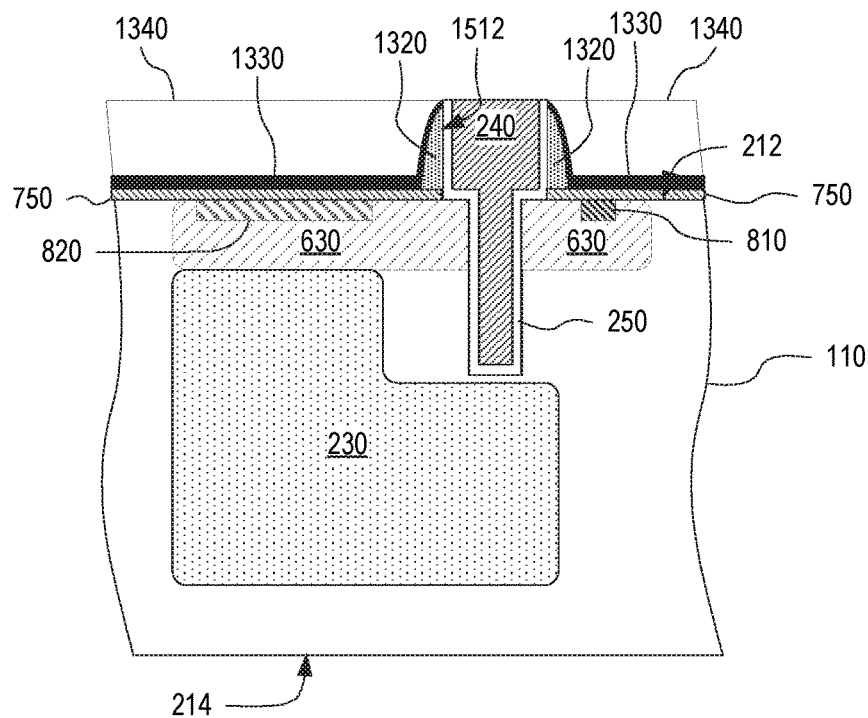

After step 1230, a step 1240 performs steps 570 and 580 of method 500 for each pixel. For example, as depicted in FIG. 15, passivation lining 250 is deposited on all surfaces of trench 1420, including on walls 1512 of spacer 1320 facing trench 1420 to protect vertical transfer gate, whereafter trench 1420 is filled with metal (such as tungsten) to form metal VTG 240 e.g., by another chemical vapor deposition (CVD) process or metal sputtering process.

In one embodiment, another metal chemical mechanical planarization (CMP) process may be formed after step 1240 to remove metals deposited in the unwanted area e.g., regions other than the metal VTGs and flatten the surface of first interlayer dielectric layer. In another embodiment, a metal etch-back process may be formed to remove excess metal deposited and flatten the surface of first interlayer dielectric layer.

Figure 16:
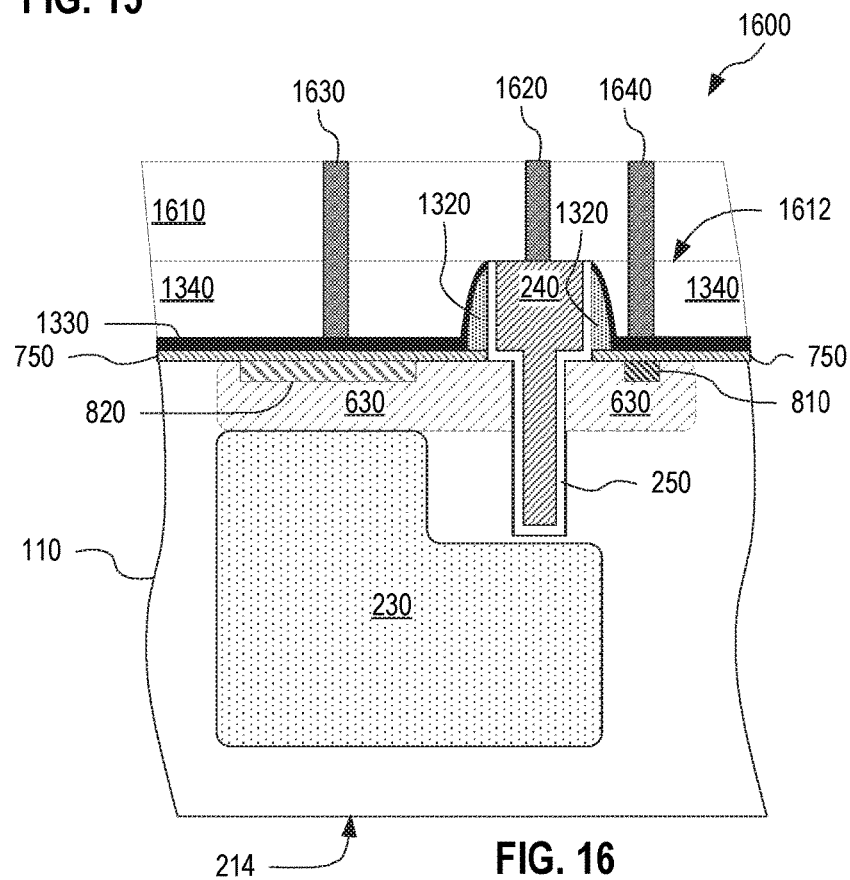

After step 1240, a step 1250 deposits a second inter-layer dielectric layer on the top surface of the first inter-layer dielectric layer and over the metal VTGs. For example, as depicted in FIG. 16, an inter-layer dielectric layer 1610 is deposited on a top surface 1612 of the inter-layer dielectric layer 1340 and over metal VTG 240. The second inter-layer dielectric layer may be an oxide, for example silicon oxide. Another chemical mechanical planarization (CMP) may be formed after step 1250 to flatten the top surface of second inter-layer dielectric (e.g., inter-layer dielectric 1610).

In step 1260, another etching process is applied to etch holes through the inter-layer dielectric layer(s) and fills the holes with metal to form contacts at least to the metal VTGs, so as to complete the manufacture of pixels 1600. For example, as depicted in FIG. 16, (a) a hole is etched through inter-layer dielectric 1610 above metal VTG 240 and filled with metal to form an electrical contact 1620 to metal VTG 240, a hole is etched through inter-layer dielectrics 1610 and 1340 (and also contact etch stop layer 1330) above pinning layer 820 and filled with metal to form an electrical contact 1630 to pinning layer 820, and (c) a hole is etched through inter-layer dielectrics 1610 and 1340 (and also contact etch stop layer 1330) above floating diffusion region 810 and filled with metal to form an electrical contact 1640 to floating diffusion region 810.

Figure 17:
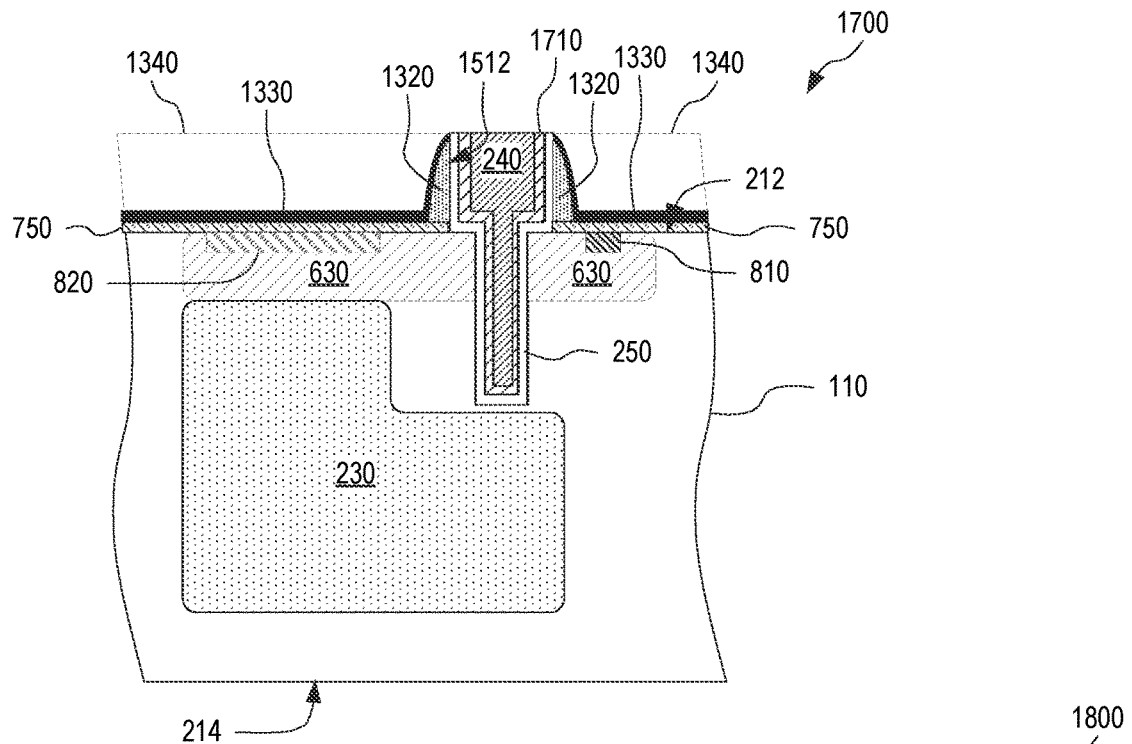
FIG. 17 illustrates a pixel including a metal VTG with a high-k dielectric passivation lining and a work-function metal for reducing the transfer gate threshold voltage, according to an embodiment.

FIG. 17 illustrates a pixel 1700 including a metal VTG with a high-k dielectric passivation lining and a work-function metal for reducing the transfer gate threshold voltage. Pixel 1700 is an embodiment of pixel 1100 that further includes a work-function metal 1710 between passivation lining 250 and metal VTG 240. The negative charges of passivation lining 250 effectively increase the threshold voltage of the vertical transfer gate, such that a higher voltage is required to turn on the vertical transfer transistor to establish a charge transfer path to transfer charges from photodiode region 230 through metal VTG 240 to floating diffusion region 810. A higher threshold voltage may result in image lag. Work-function metal 1710 counteracts this effect and reduces the effective threshold voltage.

Work-function metal 1710 may be a multilayer metal stack. For example, work-function metal 1710 may be a multilayer metal stack of a bottom layer of titanium nitride closest to passivation lining 250, a top layer of titanium nitride closest to planar cap of metal VTG 240, and a titanium-aluminum-carbon film disposed between the top and bottom titanium nitride layers. The thickness of the bottom layer of titanium nitride may be tuned to achieve a desired threshold voltage reduction.

Without departing from the scope hereof, work-function metal 1710 may be implemented in pixel 1600 between metal VTG 240 and passivation lining 250. Method 500 may be extended to deposit work-function metal 1710 in an additional metal deposition step between steps 570 and 580. Similarly, method 1200 may be extended to deposit work-function metal 1710 in step 1240.

As an alternative to adding work-function metal 1710, the concentration of n-dopants in charge overflow layer 630 may be increased. Such an increase will also counteract the threshold voltage increase caused by the negative charges in passivation lining 250.

Figure 18:
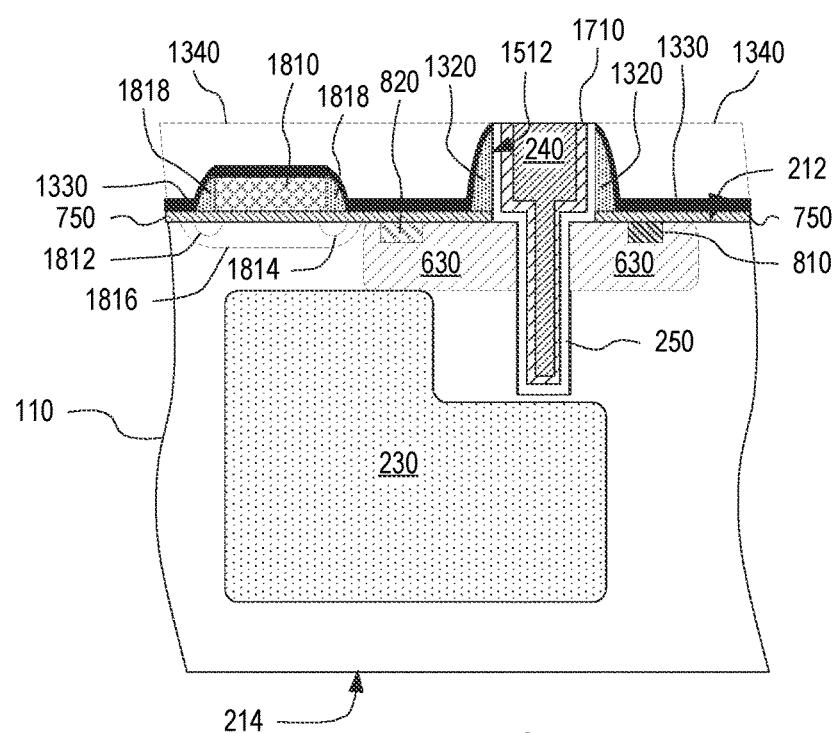
FIG. 18 illustrates a pixel that includes including a metal VTG with a high-k dielectric passivation lining as well as at least one additional gate above the photodiode region, according to an embodiment.

FIG. 18 illustrates a pixel 1800 that includes including a metal VTG with a high-k dielectric passivation lining as well as at least one additional gate 1810 above the photodiode region. Pixel 1800, as depicted in FIG. 18, is an embodiment of 1700. However, without departing from the scope hereof, each of pixels 112, 1100, and 1600 may be modified in the same fashion so as to include at least one additional gate 1810.

As discussed above in reference to FIGS. 1, 2, and 3, metal VTG 240 with passivation lining 250 enables burying photodiode region 230 deeper (e.g., a top portion of photodiode region 230 may be 200-300 nm away from the front surface 212) in semiconductor substrate 110. As a result, one or more transistor devices (e.g., reset transistor, source follower, or row select transistor) may be formed in the region above photodiode region 230 for further pixel minimization without affecting either one of the charge accumulation in photodiode region 230 and the transfer of charges out of photodiode region 230 via metal VTG 240. In the example depicted in FIG. 18, pinning layer 820 and, if present, charge overflow layer 630 are shrunk/shifted toward metal VTG 240, as compared to the configuration of pixel 1700. This leaves room to accommodate at least one gate 1810 on front surface 212 above photodiode region 230, while keeping the overall size of pixel 1800 the same as the overall size of pixel 1700.

In one embodiment, the transistor device may be formed above photodiode region 230. Gate oxide lining layer 750 may be formed during deposition of gate oxide lining layer 750, e.g., step 520, and with only the portion of gate oxide lining in the trench removed during the removal of temporary dummy VTGs as depicted in FIG. 18. For example, gate oxide lining layer 750 may cover front surface 212 outside trench 220. Spacer 1320 and contact etch stop layer 1330 are formed above gate oxide lining layer 750. In another embodiment, only a specific portion of gate oxide lining layer 750 in the designated device region on photodiode region 230 is left on front surface 212 while the rest of gate oxide lining layer 750 is removed during the formation of temporary dummy VTGs for the purpose of subsequent formation of gate electrode of the transistor device. In one embodiment, instead of gate oxide lining layer 750, a high-k dielectric layer may deposited on the region of front surface 212 of semiconductor substrate 110 underneath the gate electrode. For example, the transistor device may be a source follower, the high-k dielectric layer may deposited underneath the gate electrode 1810 of the source follower to increase the transconductance $g_m$ of the source follower, thereby increase the driving current and the operation speed of the source follower.

A gate electrode 1810 of the transistor device may be formed on a gate oxide lining layer, e.g., oxide material. The gate electrode may be an n-type polysilicon gate, and formed during the step of forming temporary dummy VTG in step 520. In one embodiment, the gate electrode is a metal gate formed according to the process of forming metal VTG (e.g., forming a dummy polysilicon gate first, then removing the dummy polysilicon gate to forming a recess, and deposit metal material, e.g., tungsten, into the recess to form the metal gate.

Source 1812 and drain 1814 of the transistor device may be formed in the semiconductor substrate 110, and may be formed during step 1210. For example, the doping regions for source and drain may be formed after the formation of temporary dummy VTG by associated masking (for marking doping regions), dopant implantation process, and annealing process. Additionally, a P-type well 1816 may be formed in the semiconductor substrate 110 by ion implantation of P-type dopant, e.g., boron (B) for additional isolation between the transistor device and photodiode region 230.

A spacer 1818 may be formed on the sides of gate electrode 1810, for example at the same time as forming spacer for metal VTG in step 1222. Further, contact etch stop layer 1330 may be disposed on gate electrode 1810 (and spacer 1818) during step 1224.

Method 500 may be extended to form gates 1810, for example in an additional gate formation step between steps 520 and 540. Similarly, method 1200 may be extended to form gates 1810 in step 1210.

Combinations of Features

Features described above as well as those claimed below may be combined in various ways without departing from the scope hereof. For example, it will be appreciated that aspects of one image sensor or associated method described herein, may incorporate features or swap features of another image sensor or associated method described herein. The following examples illustrate some possible, non-limiting combinations of embodiments described above. It should be clear that many other changes and modifications may be made to the methods, products, and systems herein without departing from the spirit and scope of this invention:

(A1) A method for manufacturing an image sensor may include, for each of a plurality of photosensitive pixels of the image sensor, (a) forming a trench in a semiconductor substrate of the image sensor, (b) depositing temporary transfer gate material in and above the trench, (c) after the step of depositing temporary transfer gate material, high-temperature annealing at least a portion of the semiconductor substrate, and (d) after the step of high-temperature annealing, (i) removing the temporary transfer gate material, thereby reopening the trench, (ii) depositing a passivation lining, having a high-k dielectric, in the reopened trench, and (iii) depositing metal on the passivation lining to form a metal vertical transfer gate in the trench and extending above the trench.

(A2) In the method denoted as (A1), the thickness of the passivation lining may be in range between 10 and 300 Angstrom.

(A3) Ether of the methods denoted as (A1) and (A2) may further include, for each of the plurality of photosensitive pixels of the image sensor, implanting dopants in the semiconductor substrate to form a plurality of doped regions before the step of forming the trench, and, in the step of high-temperature annealing, annealing the doped regions.

(A4) The method denoted as (A3) may include (1) in the step of implanting comprising, forming an n-doped region of a photodiode, wherein the n-doped region is at least 180 nanometers below a front surface of the semiconductor substrate, and (2) in the step of forming, forming the trench to extend from the front surface to a first depth that is at least 300 nanometers below the front surface.

(A5) In the method denoted as (A4), the steps of forming and implanting may cooperate to position the n-doped region of the photodiode partly beneath the trench.

(A6) Any of the methods denoted as (A3) through (A5) may include, in the step of implanting, forming an n-doped region of a photodiode, and, in the step of forming the trench, forming the trench to be less than 50 nanometers away from the n-doped region of the photodiode.

(A7) Any of the methods denoted as (A3) through (A6) may include, in the step of implanting, forming an n-doped region of a photodiode, and, in the step of forming, forming the trench to contact the n-doped region.

(A8) In any of the methods denoted as (A3) through (A7), the step of implanting may include, prior to the step of forming the trench, (I) forming an n-doped region of a photodiode, wherein the n-doped region is away from a front surface of the semiconductor substrate, wherein the front surface is the surface of the semiconductor substrate in which the trench is formed, and (II) forming an n-doped charge overflow layer between the front surface and the n-doped region of the photodiode, wherein the charge overflow layer is shallower than the n-doped region of the photodiode.

(A9) The method denoted as (A8) the step of implanting may include, after the step of depositing temporary transfer gate material and before the step of high-temperature annealing, (I) implanting n-dopant to a first local region of the charge overflow layer at the front surface to form a floating diffusion region configured to serve as a drain for the metal vertical transfer gate, and (II) implanting p-dopant to a second local region of the charge overflow layer at the front surface to form a pinning layer for the photodiode.

(A10) In any of the methods denoted as (A1) through (A9), the step of depositing temporary transfer gate material may include lining the trench and a portion of a front surface, of the semiconductor substrate, adjacent the trench with a gate dielectric, and depositing non-metal gate material on the gate dielectric.

(A11) The method denoted as (A10) may further include, before the step of removing, depositing fill material on the front surface to fill space between the temporary transfer gate material deposited for each of the photosensitive pixels, such that the step of removing further produces an opening in the fill material above the portion of the front surface adjacent the trench.

(A12) In the method denoted as (A11), the step of depositing the passivation lining may further include lining the opening, and the step of depositing metal may include filling regions of the trench and the opening not occupied by the passivation lining.

(A13) Any of the methods denoted as (A1) through (A12) may further include (1) before the step of removing, depositing fill material on a front surface of the semiconductor substrate to fill space between the temporary transfer gate material deposited for each of the photosensitive pixels, such that the step of removing further produces an opening in the fill material above the portion of the front surface adjacent the trench, and (2) after the step of depositing metal, for each of the photosensitive pixels, (I) depositing a dielectric layer on the fill material and over the metal vertical transfer gate, wherein the dielectric layer has a top surface facing away from the semiconductor substrate, and (II) forming a metal contact from the top surface through the dielectric layer to the metal vertical transfer gate.

(A14) The method denoted as (A13) may further include, after the step of depositing metal and for each of the photosensitive pixels, forming metal contacts from the top surface through the dielectric layer and through the fill material to a floating diffusion region and a photodiode pinning layer, both located in the semiconductor substrate at the front surface.

(A15) Any of the methods denoted as (A1) through (A14) may further include depositing a work-function metal between the passivation lining and the metal, to reduce transfer gate threshold voltage.

(B1) An image sensor may include a semiconductor substrate with a plurality of photosensitive pixels, wherein each of the pixels includes (a) a photodiode region of the semiconductor substrate, (b) in and above a trench of the semiconductor substrate, a vertical transfer gate containing metal, and (c) along interfaces between the semiconductor substrate and the vertical transfer gate, a passivation lining containing a high-k dielectric, wherein a minimum distance between the passivation lining and the photodiode region is less than 50 nanometers.

(B2) In the image sensor denoted as (B1), the vertical transfer gate may extend through a front surface of the semiconductor substrate to a first depth into the semiconductor substrate, the photodiode region may be a distance away from the front surface, and the depth range of the photodiode region may overlap with the depth range of the vertical transfer gate.

(B3) In the image sensor denoted as (B2), the photodiode region may be at least 180 nanometers below the front surface, and the first depth may be at least 300 nanometers.

(B4) In either of the image sensors denoted as (B2) and (B3), the photodiode region may be partly beneath the vertical transfer gate.

(B5) In any of the image sensors denoted as (B1) through (B4), the bottom of the trench may contact the photodiode region.

(B6) In any of the image sensors denoted as (B1) through (B5), the thickness of the passivation lining may be in the range between 10 and 300 Angstrom.

(B7) In any of the image sensors denoted as (B1) through (B6), each of the photosensitive pixels may further include a hole accumulation layer in the semiconductor substrate at interface with the passivation lining.

(B8) In any of the image sensors denoted as (B1) through (B7), each of the photosensitive pixels may further include (i) a floating diffusion region in the semiconductor substrate at a front surface thereof, wherein the front surface is interrupted by the trench, and the floating diffusion region is a distance away from the vertical transfer gate and being n-doped at a first concentration, and (ii) a charge overflow layer in the semiconductor substrate between the top surface and the photodiode region, wherein the charge overflow region connects the photodiode region to the floating diffusion region, and the charge overflow layer is n-doped at a second concentration that is less than the first concentration.

(B9) Any of the image sensors denoted as (B1) through (B8) may further include, in each of the photosensitive pixels, (i) a floating diffusion region in the semiconductor substrate at a front surface thereof, wherein the front surface is interrupted by the trench, and (ii) a photodiode pinning layer in the semiconductor substrate at the front surface.

(B10) The image sensor denoted as (B9) may further include (1) a dielectric layer deposited on the front surface and on the vertical transfer gate of each photosensitive pixel, wherein the dielectric layer has a top surface facing away from the semiconductor substrate, and (2) for each of the photosensitive pixels, metal contacts passing through the dielectric layer to the vertical transfer gate, the floating diffusion region, and the photodiode pinning layer.

(B11) The image sensor denoted as (B10), wherein the photodiode region is n-doped, and the photodiode pinning layer is p-doped.

(B12) Any of the image sensors denoted as (B1) through (B11) may further include a transistor device, formed above the photodiode region, wherein the transistor device includes a gate on a front surface of the semiconductor substrate.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present systems and methods, which, as a matter of language, might be said to fall therebetween.

What is claimed is:
1. An image sensor, comprising:
a semiconductor substrate with a plurality of photosensitive pixels, each of the pixels including:
a photodiode region of the semiconductor substrate;
in and above a trench of the semiconductor substrate, a vertical transfer gate containing metal;
a floating diffusion region in the semiconductor substrate at a front surface thereof, the front surface being interrupted by the trench, the floating diffusion region being a distance away from the vertical transfer gate and being n-doped at a first concentration; and a charge overflow layer in the semiconductor substrate between the front surface and the photodiode region, the charge overflow layer in contact with and shallower than the photodiode region and connecting the photodiode region to the floating diffusion region, the charge overflow layer being n-doped at a second concentration that is less than the first concentration; and along interfaces between the semiconductor substrate and the vertical transfer gate, a passivation lining containing a high-k dielectric, a minimum distance between the passivation lining and the photodiode region being less than 50 nanometers.

2. The image sensor of claim 1, wherein the vertical transfer gate extends through a front surface of the semiconductor substrate to a first depth into the semiconductor substrate, the photodiode region being a distance away from the front surface, and a depth range of the photodiode region overlapping with a depth range of the vertical transfer gate.

3. The image sensor of claim 2, wherein the photodiode region is at least 180 nanometers below the front surface, the first depth being at least 300 nanometers.

4. The image sensor of claim 2, wherein the photodiode region is partly beneath the vertical transfer gate.

5. The image sensor of claim 1, wherein a bottom wall of the trench contacts the photodiode region.

6. The image sensor of claim 1, wherein a thickness of the passivation lining is in a range between 10 and 300 Angstrom.

7. The image sensor of claim 1, wherein each of the photosensitive pixels further includes a hole accumulation layer in the semiconductor substrate at interface with the passivation lining.

8. The image sensor of claim 1, further comprising:
in each of the photosensitive pixels:
a photodiode pinning layer in the semiconductor substrate at the front surface;
a dielectric layer deposited on the front surface and on the vertical transfer gate of each photosensitive pixel, the dielectric layer having a top surface facing away from the semiconductor substrate; and
for each of the photosensitive pixels, metal contacts passing through the dielectric layer to the vertical transfer gate, the floating diffusion region, and the photodiode pinning layer.

9. The image sensor of claim 8, wherein the photodiode region is of an n-type doped region and the photodiode pinning layer is a p-type doped layer.

10. The image sensor of claim 8, wherein the photodiode pinning layer and the floating diffusion region are embedded in the charge overflow layer.

11. The image sensor of claim 1, further comprising:
a transistor device, above the photodiode region, the transistor device including a gate on the front surface of the semiconductor substrate.

12. The image sensor of claim 1, wherein the photodiode region further comprises:
a stepped shape wherein a first portion of the photodiode region is laterally spaced from the sidewalls of the vertical transfer gate, and a second portion is vertically spaced from a bottom of the vertical transfer gate.

13. The image sensor of claim 1, further comprising:
a work function metal disposed along interfaces between the passivation lining and the vertical transfer gate to reduce an effective threshold voltage of the vertical transfer gate.

* * * * *